United States Patent [19]

Clark et al.

[11] Patent Number: 5,178,370
[45] Date of Patent: Jan. 12, 1993

[54] CONDUCTIVITY MODULATED INSULATED GATE SEMICONDUCTOR DEVICE

[75] Inventors: Lowell E. Clark, Phoenix; Robert B. Davies, Tempe, both of Ariz.

[73] Assignee: Motorola Inc., Schaumburg, Ill.

[21] Appl. No.: 740,267

[22] Filed: Aug. 5, 1991

[51] Int. Cl.⁵ .................. H01L 29/10; H01L 21/265
[52] U.S. Cl. ................................. 257/212; 257/378; 257/408; 257/577; 437/40; 437/44; 437/31
[58] Field of Search ............... 357/23.4, 43; 437/31, 437/40, 44

[56] References Cited

U.S. PATENT DOCUMENTS

| | | | |
|---|---|---|---|
| 5,070,377 | 12/1991 | Harada | 357/23.4 |
| 5,079,607 | 1/1992 | Sakuri | 357/23.4 |
| 5,121,176 | 6/1992 | Quigg | 357/23.4 |

*Primary Examiner*—Edward J. Wojciechowicz
*Attorney, Agent, or Firm*—Stuart T. Langley

[57] ABSTRACT

A vertical conducting insulating gate bipolar transistor having an emitter region formed in a base region wherein the base region is not shorted to the emitter is provided. The emitter and base regions are formed in an upper portion of a lightly doped semiconductor drift region and an anode region is formed in a bottom portion of the drift region. During forward conduction, minority carriers are injected from the anode into the base region, biasing the base region sufficiently to inject minority carriers into the upper surface of the drift region. The injected minority carriers improve conductivity in the upper portion of the drift region.

11 Claims, 3 Drawing Sheets

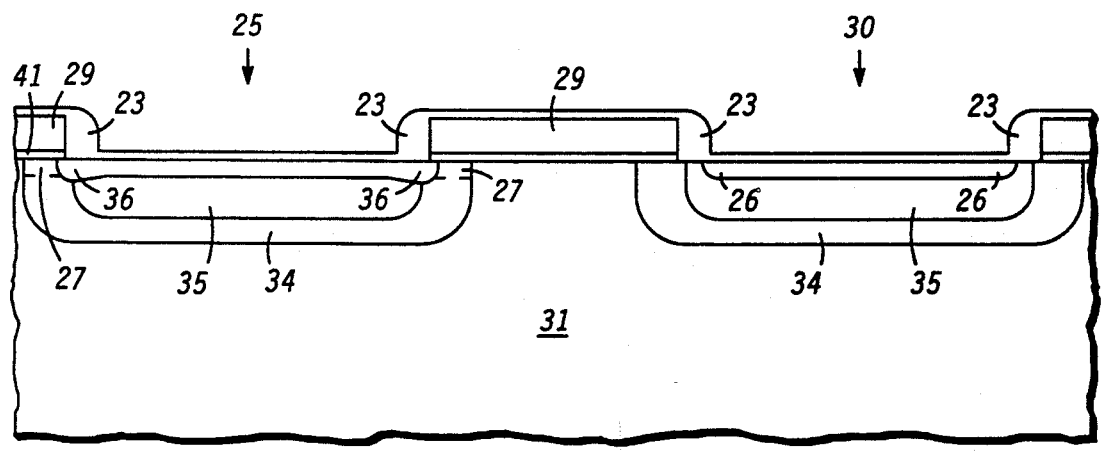
FIG. 5
FIG. 6
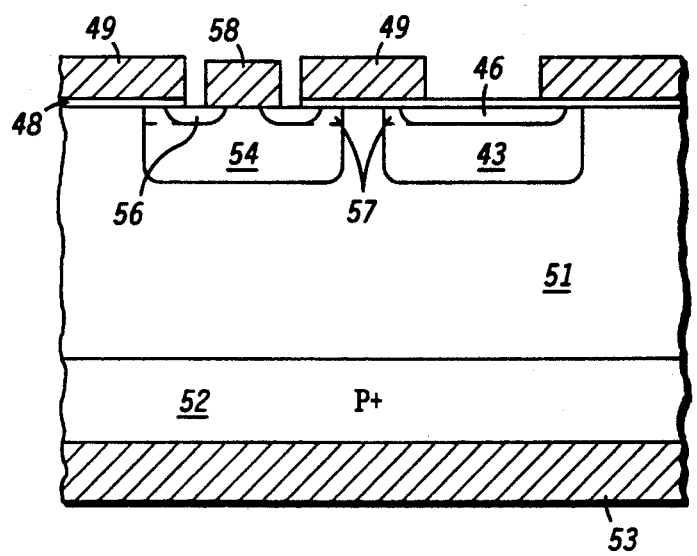

CONDUCTIVITY MODULATED INSULATED GATE SEMICONDUCTOR DEVICE

BACKGROUND OF THE INVENTION

The present invention relates to an insulated gate semiconductor device and more particularly, to a low on resistance device having minority carrier injection.

Insulated gate semiconductor devices possess the desirable feature of having a high impedance gate which simplifies gate drive circuitry. Insulated gate semiconductor devices can serve as high current, high power switches. Such devices as insulated gate bipolar transistors (IGBTs) are widely available. An N-channel power insulated gate device, for example, comprises a body of semiconductor material having a top surface containing a highly doped N-type conductivity source region, a moderately doped P-type conductivity base region and a moderately to lightly doped N-type conductivity drift region. The drift region is formed on a highly doped P-type conductivity anode region for an IGBT. The anode region is also referred to as a collector or a drain region. The anode region forms a bottom surface of the semiconductor body. Source and anode electrodes are attached to the source and anode regions, respectively, for coupling to external circuitry for carrying load current that flows through the device.

The drift region has relatively high resistivity to support high breakdown voltages. This high resistivity increases on resistance of the device during forward conduction, however. IGBTs use a P-type anode which provides a PN junction at the interface between the anode region and the drift region. This PN junction becomes forward biased when anode potential is greater than source potential by more than about 0.7 volts, and the PN junction injects minority carriers into the drift region, increasing conductivity and lowering on resistance. Unfortunately, the drift region is relatively thick, so minority carrier injection from the bottom of the drift region improves conductivity primarily in a lower portion of the drift region. Only a small percentage of the injected minority carriers reach an upper surface of the semiconductor body; on resistance remains high in the upper portion of the drift region.

Conventionally, the base region is electrically shorted to the source region to prevent activation of a parasitic bipolar transistor formed by the source which acts as an emitter, the base region which acts as a base, and the drift region which acts as a collector. Because the base to source PN junction was shorted it could not became forward biased during conduction, therefore it could not provide minority carrier injection into the upper portion of the drift region. A DMOS design described in U.S. Pat. No. 4,743,952 issued to B. J. Baliga provides separate hole injection regions in the upper surface of the drift region. These hole injection regions, however, were biased from a potential at the upper surface of the drift region. Potential at the upper surface is a very small potential in a properly designed MOS device. An insulated gate device structure is needed having a self biased means for conductivity modulating the upper portion of the drift region.

SUMMARY OF THE INVENTION

The advantages of the present invention are achieved by a vertical insulated gate semiconductor device having an emitter region formed in a base region wherein the base region is not shorted to the emitter. The emitter and base regions are formed in an upper portion of a lightly doped semiconductor drift region and an anode region is formed in a bottom portion of the drift region. During forward conduction, minority carriers are injected from the anode into the base region, biasing the base region sufficiently to modulate conductivity in the upper surface of the drift region.

BRIEF DESCRIPTION OF THE DRAWINGS

FIG. 5 illustrates the embodiment shown in FIG. 4 in cross sectional view at a later stage of processing; and FIG. 6 illustrates a highly simplified cross-sectional view of a portion of an insulated gate semiconductor device in accordance with a third embodiment of the present invention.

DETAILED DESCRIPTION OF THE DRAWINGS

Figure 1:
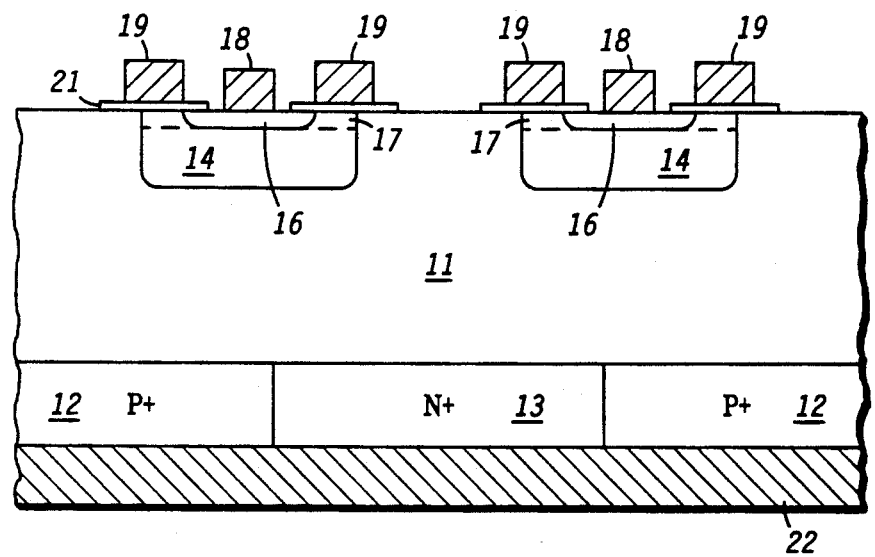
FIG. 1 illustrates a highly simplified cross-sectional view of a portion of an insulated gate semiconductor device in accordance with the present invention.

FIG. 1 illustrates a highly simplified cross-sectional view of an insulated gate semiconductor device in accordance with the present invention. Although the preferred embodiment is described in terms of an N-channel insulated gate device, it should be understood that P-channel insulated gate devices can be manufactured with minor modifications of the preferred embodiment. The IGBT of the present invention comprises a plurality of identical field effect transistor (FET) cells formed in a semiconductor body, each cell comprising a source 16, base 14, gate dielectric 21, gate electrode 19, and source electrode 18. Each cell is formed in an upper surface of drift region 11 using conventional ion implantation, diffusion, and thin film processing techniques.

Drift region 11 is lightly doped N-type for an N-channel device. For example, silicon layers having a doping concentration in the range of $1 \times 10^{14}$ atoms per cubic centimeter are often used. Base 14 is moderately doped P-type and source 16 is heavily doped N-type. Channels 17, indicated by dashed lines, are formed in base 14 underneath gate electrode 19. For an N-channel device, a positive voltage on gate electrode 19 induces an N-type channel 17 at the surface coupling source 16 to drift region 11. Source 16 may be formed by ion implantation and anneal, or by other known diffusion techniques. Source 16 may comprise phosphorous doping atoms, or in a preferred embodiment comprise arsenic doping atoms. An important feature of the present invention is that base 14 and emitter 16 are not shorted together as is done in conventional IGBTs. Base 14 has a floating potential, the utility of which will become more apparent.

Anode regions 12 comprise a heavily doped P-type region formed on the bottom portion of drift region 11. A plurality of drain regions 13 comprising heavily doped N-type regions are optionally formed on a bottom surface of drift region 11. Conventional IGBTs comprise only anode regions 12, and such a design is compatible with the present invention. However, low current performance advantages are obtained by forming both drain and anode regions. A drain electrode 22 is formed shorting together anode regions 12 and drain regions 13 on a bottom surface of the semiconductor device. Drain electrode 22, source electrode 18, and gate electrode 19 are adapted to be coupled to external circuitry for conducting current through the insulated gate semiconductor device.

In normal operation, source electrodes 18 are coupled to a ground potential while a positive voltage is applied to drain electrode 22. When more than a few tenths of a volt are applied to drain electrode 22, the PN junction formed between anode regions 12 and drift region 11 is forward biased. The forward biased PN junction injects holes into drift region 11. These holes modulate conductivity of drift region 11 greatly reducing the on resistance of the device. Anode regions 12, when forward biased, are an example of a means for injecting minority carriers into drift region 11.

Conductivity improvement is proportional to concentration of injected holes over a wide range of operating conditions and hole concentrations. Anode regions 12 result in a concentration of injected holes which is greatest near a lower portion of drift region 11 and decreases rapidly near an upper portion of drift region 11. Because of this, the conductivity modulation effect due to anode regions 12 is most pronounced at the lower portion of drift region 11 and is minimal at an upper surface of drift region 11 in conventional IGBTs.

A distinguishing feature of the present invention is that holes which are injected and reach base region 14 are collected by base region 14 and raise the potential of base region 14 because base 14 is not shorted to source 16. As holes are collected by base region 14, the PN junction formed by base region 14 and drift region 11 becomes forward biased. The forward biased base/drift region diode activates a parasitic NPN transistor, injecting holes into the upper surface of drift region 11. Thus, base 14 formed in accordance with the present invention is an example of a means for injecting holes into the upper portion of drift region 11. This feature results in a more uniform distribution of injected holes in drift region 11 so that significant hole concentrations exist at both the upper and lower surfaces of drift region 11.

An NPN bipolar transistor is formed having source 16 as an emitter, base 14 as a base, and drift region 11 as a collector. A PNP transistor is formed having base 14 as a collector, drift region 11 as a base, and anode regions 12 as an emitter. To ensure that the device does not latch into an on state, it is important that gain of the NPN transistor multiplied by gain of the PNP transistor is less than unity. This condition can be met by providing a moderately higher doping concentration in base 14 to reduce gain of the NPN transistor. Also, a heavily doped shallow source region 16 reduces injection efficiency and gain of the NPN transistor. Doping distribution of base 14 must be tailored to provide a desired threshold voltage and conductivity in channel 17 as well as low gain for the parasitic NPN transistor. It may be desirable to use multiple boron implants at various doses and energies to achieve low threshold voltage with low resistivity underneath source 16. It is believed that a base resistivity of about 50 ohms/square underneath source 16 is sufficient to prevent device latching in an on condition.

When gate bias is removed from electrode 19, electron current through channel 17 is greatly reduced. Because the product of NPN and PNP gains of the parasitic bipolar transistors is less than one, current flow due to bipolar action will rapidly turn off soon after electron current through channel 17 is eliminated. In this manner, the enhanced conductivity device is under the complete control of gates 19 while at the same time taking full advantage of both channel current 17, bipolar current, and hole injection from base 14 to drift region 11.

Figure 2:
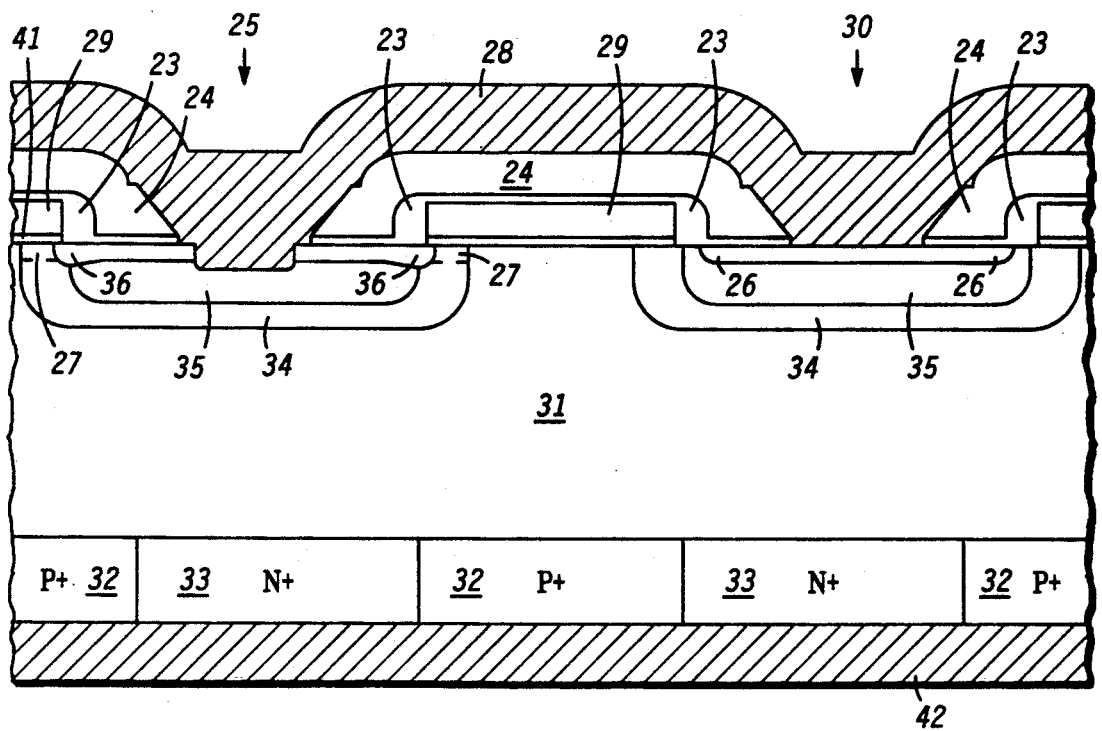
FIG. 2 illustrates an enlarged cross section of a second embodiment in accordance with the present invention.

A second embodiment of the present invention is shown in FIG. 2. The embodiment described in reference to FIG. 1 uses a single cell design wherein each cell provides both bipolar and MOSFET switching. In the embodiment shown in FIG. 2, however, MOSFET cell 25 performs primarily FET switching while bipolar cell 30 provides purely bipolar switching. This division of function eases processing and allows each cell design to be optimized for the particular switching function.

Drift region 31 is similar in function and design to drift region 11 described in reference to FIG. 1. Likewise, anode regions 32 are similar to anode regions 12, drain regions 33 are similar to drain regions 13, drain electrode 42 is similar to drain electrode 22, and gate dielectric 41 and gate electrode 29 are similar to gate dielectric 21 and electrode 19 described in reference to FIG. 1. FET cell 25 conducts current from source electrode 28, through source region 36 and channel 27 to drift region 31. In contrast, bipolar cell 30 conducts current from source electrode 28 through emitter region 26. Current flows from emitter 26 through floating base 35 to drift region 31 only when sufficient bias develops on floating base 35. Dielectric 24 insulatingly separates gate electrode 29 from source electrode 28. Structure and function of sidewall spacers 23 will be described in more detail hereinafter.

Figure 3:
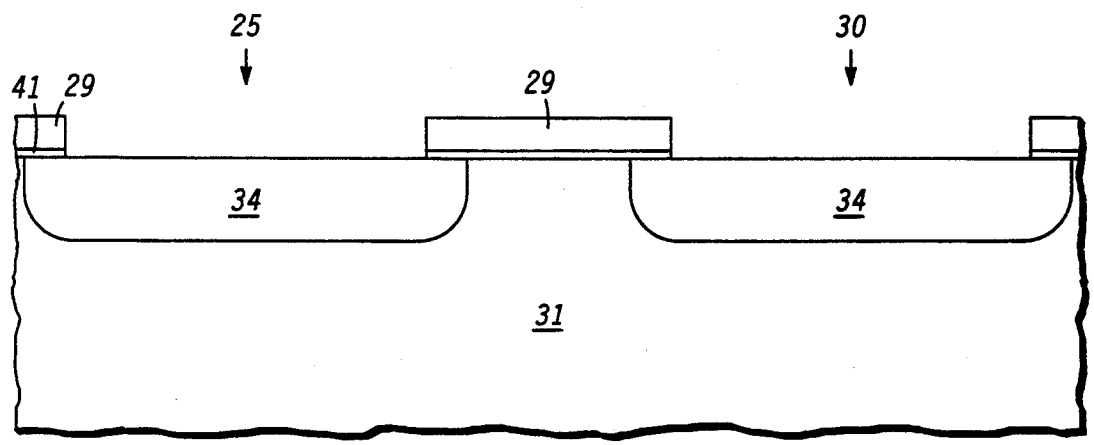
FIG. 3 illustrates a preferred method of making the embodiment shown in FIG. 2 in cross sectional view at an early stage of processing.

FIG. 3 illustrates the embodiment shown in FIG. 2 at an early stage in processing. Base diffusion 34 is formed in both FET cell 25 and bipolar cell 30 using gate electrode 29 as a mask. It may be desirable in some designs to use additional masking steps to provide one implant dose for base 34 in FET cell 25 an another implant dose for base 34 in bipolar cell 30. Most conveniently, however, both types of cells receive a similar boron implant dose and redistribution.

Figure 4:
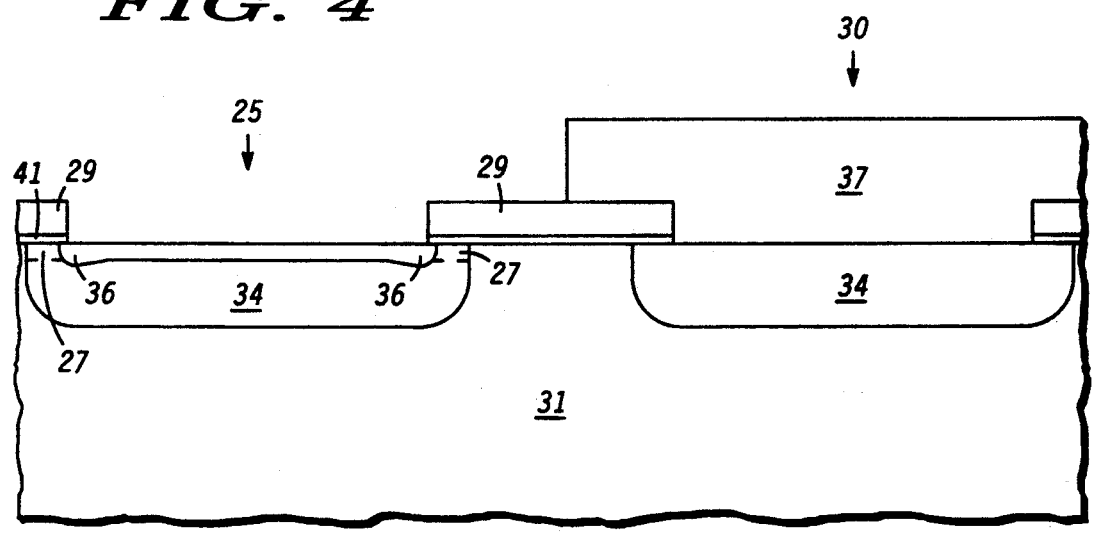
FIG. 4 illustrates the embodiment shown in FIG. 3 in cross sectional view at a later stage of processing.

Following formation of base 34, bipolar cells 30 are blocked by mask 37 comprising photoresist or the like as shown in FIG. 4. Source 36 is formed in FET cells 25 using gate electrode 29 as a mask. A preferred method for forming source 36 is by arsenic ion implant to create a very shallow, heavily doped source 36. Channel 27 is defined between the lateral boundaries of source 36 and base 34 underneath gate electrode 29. Conductivity of channel 27 is controlled by voltage applied to gate electrode 29.

As shown in FIG. 5, sidewall spacers 23 are formed using conventional thin film techniques. Conveniently, a thin layer of dielectric material a few hundred angstroms thick is left covering the surface of gate electrode 29 source 36, and base 34 in bipolar cell 30 to limit damage caused by ion implantation. Sidewall spacers 23 serve as an implant mask, thus thickness and material composition must be carefully chosen to produce a dependable implant mask. It has been found that hot-wall TEOS oxide is a suitable material. An ion implant of a dopant having the same conductivity as source 36 is implanted, such as arsenic. FET cell 25 thus receives a double implant into center portions of source 36, which lowers source resistivity somewhat. Emitter region 26 is formed in bipolar cell 30 using sidewall spacer 23 as a mask. It is important to note that emitter 26 does not extend under gate electrode 29, thus no channel is formed in bipolar cell 30. Bipolar cell 30 will not conduct current as a result of bias applied to gate electrode 29.

This implant is followed by a relatively heavy implant of the same conductivity dopant as base 34, boron in the preferred embodiment, to form low resistivity regions 35. In FET cell 25, low resistivity region 35 lowers gain of the parasitic NPN transistor, resulting in a more rugged FET cell. In bipolar cell 30, low resistivity region 35 provides a heavily doped base region for the bipolar cell, reducing its gain. Reduced gain in bipolar cell 30 prohibits regenerative latch up of the insulated gate device.

Referring again to the completed device shown in FIG. 2, usually source electrode 28 is coupled to ground and drain electrode 42 is coupled to a positive voltage. A PN junction formed by anode regions 32 and drift region 31 becomes forward biased by the drain potential. When a bias potential is coupled to gate electrode 29, drain-to-source current flows through channel 27. Once current flow begins, anode regions 32 inject minority carriers into drift region 31, lowering conductivity dramatically. Some of the injected carriers are injected into base region 35 of bipolar cell 30, providing a base bias for bipolar cell 30. Once sufficient base bias is provided by the injected minority carriers, bipolar cell 30 is activated and minority carrier flow begins from emitter 26 to drift region 31, thus conductivity modulating the upper portion of drift region 31.

In the second embodiment, bipolar cell 30 provides a means for injecting minority carriers into the upper portion of drift region 31. Bipolar cell 30 is biased by injected carriers from anodes 32, and does not require separate biasing structures or electronics. It is important to note that the ratio of FET cells 25 to bipolar cells 30 can vary widely to achieve various levels of device performance and ruggedness.

A third embodiment in accordance with the present invention is illustrated in FIG. 6. Drift region 51 has an upper and a lower surface. Anode region 52 is formed in the lower surface of drift region 51. It should be understood that any embodiment of the present invention may have only an anode region, or may optionally have both anode and drain regions formed in the lower surface of drift region 51. Drain electrode 53 is coupled to anode region 52. Gate dielectric 48 and patterned gate electrode 49 are formed on the upper surface of drift region 51.

FET base region 54 has an opposite conductivity type from drift region 51, and is formed in an upper portion of drift region 51. Bipolar base region 43 also is of an opposite conductivity from drift region 51 and formed in an upper surface of drift region 51. Both FET base 54 and bipolar base 43 are conveniently formed simultaneously so that portions of each base region 54 and 43 extend under gate electrode 49, using gate electrode 49 as a mask. FET base 54 and bipolar base 43 are not electrically coupled. A portion of drift region separates FET base 54 from bipolar base 43.

Source regions 56 are doped heavily to the same conductivity type as drift region 51. Arsenic is a suitable dopant and ion implantation is a suitable means of doping, although other common doping methods may be used. Gate electrode 49 may also be used as a mask for forming source regions 56, but additional masks may be required to prevent dopant from reaching a central portion of FET base 54. Many masking techniques are known for providing such a geometry, and any of these well-known geometries and process flows may be used. A common geometry is a vertical double diffused metal oxide semiconductor field effect transistor (DMOS FET). Channels 57 are thus provided in a portion of FET base 54 under gate electrode 49 between a lateral boundary of source region 56 and drift region 51. Source electrode 58 couples to source regions 56 for carrying current in the device. Source electrode 58 shorts FET base 54 to source regions 56.

Emitter 46 comprises a region of similar conductivity type to drift region 51, and is formed in bipolar base 43. Emitter 46 is preferably tub shaped as shown in FIG. 6, but may also be ring shaped, like source regions 56, or take on other geometries. A channel 57 is also formed between an edge of emitter 46 and drift region 51. Unlike source regions 56, however, it is not necessary to couple source electrode 58 to emitter 46. Bipolar base 43 is not shorted to emitter 46, and is electrically floating. It should also be noted that channel 57 is formed in both FET base 54 and bipolar base 57 so that a single gate electrode 49 controls conductivity of both channels 57.

Although illustrated as a single FET base 54 and a single bipolar base 43, it should be understood that many of each kind of cell would be formed on a single device. The ratio of bipolar to FET devices may be altered to vary on-state characteristics and safe operating area of the insulated gate device.

In operation, a bias on gate electrode 49 makes channels 57 conductive. First, channels 57 conduct majority carrier current between drain electrode 53 and source electrode 58. This majority carrier current results in minority carrier injection from anode region 52, as described hereinbefore. Base 43 becomes forward biased, as a result of injected minority carriers from anode 52. This self-biasing feature of base 43 is particularly useful in eliminating need for additional circuitry to bias bipolar base 43.

Second, when channels 57 are conductive, emitter 46 is coupled to source 56. The bias on gate 49 not only causes channels 57 to be conductive, but enhances conductivity of the portion of drift region 51 which separates FET base 54 from bipolar base 43. Thus, a low resistance coupling is created between source regions 56 and emitter 46. Because base 43 is forward biased, the four layer thyristor structure created by emitter 46, bipolar base 43, drift region 51, and anode 52 turns on, and conducts current through the device with extremely low resistance and voltage drop.

When bias is removed from gate electrode 49, current cannot flow through channels 57, resulting in a drop in majority carrier flow from source 56 to drain 53, and a corresponding drop in injected minority carriers from anode 52 to drift region 51. The reduction in minority carrier injection, in turn, tends to turn off the four layer thyristor structure. When channels 57 become non-conductive, emitter 46 is no longer coupled to source 56. Instead, emitter 46 is floating, and no current path will exist between source electrode 58 and drain electrode 53 for the four layer structure, so regenerative latch up is avoided.

By now, it should be appreciated that an insulated gate semiconductor device having a high density of minority carriers in an upper portion of the drift region is provided. A base region is not shorted to a source region, allowing the base region to become forward biased to inject holes into the upper portion of the drift region. Base region resistivity is carefully controlled to prevent regenerative latch up of the device. In this manner, holes can be injected in the upper portion of the drift region and bias is provided to the hole injection means by an anode region formed on the bottom side of the device, greatly improving compactness of the device design as well as performance.

What we claim:

1. A method of making an conductivity modulated insulated gate semiconductor device comprising: providing a substrate of a first conductivity type having an upper and a lower surface; forming a drift region of a second conductivity type on the upper surface of the substrate; forming a patterned gate insulator on an upper surface of the drift region; forming a patterned gate electrode on the gate insulator; forming a plurality of base regions of the first conductivity type in the drift region and having a portions extending underneath the patterned gate insulator; forming a source region of the second conductivity type in at least one base region, wherein the source has a portion extending under the gate insulator; forming an emitter region of the second conductivity type in at least one base region, wherein the emitter region does not extend under the patterned gate insulator; forming a drain electrode coupled to the substrate; and forming a source electrode coupled to the source region and emitter region such that the source electrode does not electrically couple to the base region.

2. The method of claim 1 wherein the step of forming the base regions comprises implanting boron into the drift region using the patterned gate electrode as a mask such that the final resistivity of the base region is in the range of fifty ohms per square.

3. The method of claim 1 wherein the step of forming the source region comprises implanting arsenic into at least some of the base regions using the patterned gate electrode as a mask.

4. The method of claim 1 wherein the steps of forming a source region and forming an emitter region are performed simultaneously using a single mask.

5. The method of claim 3 further comprising the steps of: forming a sidewall spacer adjacent to the gate electrode; forming a low resistivity region of the second conductivity type in the base regions using the sidewall spacer as a mask; and implanting arsenic into some of the base regions using the sidewall spacer as a mask.

6. A conductivity modulated insulated gate semiconductor device comprising: a first semiconductor region having a portion of a first conductivity type serving as a drain; a drain electrode coupled to the first semiconductor region; a drift region of a second conductivity type having a lower portion coupled to the first semiconductor region and an upper portion; a patterned gate electrode formed on the upper surface of the drift region; an insulated gate field effect transistor having a source region of the second conductivity type and a channel region formed in a first portion of the upper surface of the drift region, wherein the source region extends under the patterned gate electrode; a bipolar transistor having a base region and an emitter region formed in a second portion of the upper surface of the drift region; and a source electrode electrically coupling to the source region and the emitter region, wherein the emitter region does not extend under the patterned gate insulator, and the drift region serves as a collector for the bipolar transistor.

7. The conductivity modulated insulated gate semiconductor device of claim 6 wherein the field effect device is a vertical double diffused metal oxide semiconductor field effect transistor.

8. The conductivity modulated insulated gate semiconductor device of claim 6 wherein the first semiconductor region further comprises a plurality of regions of the second conductivity type which are coupled to the drift region and to the drain electrode.

9. A conductivity modulated insulated gate semiconductor device comprising: a semiconductor drift region of a first conductivity type having an upper surface; a patterned gate insulator formed on the upper surface of the drift region; a patterned gate electrode formed on the gate insulator; a number of base regions of a second conductivity type formed in the upper surface of the drift region, each base region having a channel portion extending under the gate electrode, wherein the base regions are separated from each other by a portion of the upper surface of the drift region; a number of source regions of the first conductivity type, wherein each of the number of source regions is formed in one of a first subset of the base regions and extend under the gate electrode and the source regions are shallower than the base regions; a number of emitter regions of the first conductivity type, wherein each of the number of emitter regions is formed in one of a second subset of the base regions and the emitter regions are shallower than the base regions, wherein no portion of the emitter regions extends under the patterned gate electrode; a drain electrode coupled to the drift region; and a source electrode coupled to the source regions and coupled to the first subset of the base regions.

10. The insulated gate device of claim 9 further comprising a means for injecting charge carriers into the second subset of the base regions.

11. The insulated gate device of claim 10 wherein the means for injecting charge carriers comprises a region of the second conductivity type formed in the drift region and coupled to the drain electrode.

* * * * *